(12) United States Patent
Inata

(10) Patent No.: US 7,423,097 B2
(45) Date of Patent: Sep. 9, 2008

(54) GLYCIDYLOXY GROUPS-CONTAINING POLYBUTADIENE, MONO-OXETANE COMPOUND AND CATIONIC PHOTOINITIATOR

(75) Inventor: Kazumasa Inata, Aichi (JP)

(73) Assignee: Toagosei Co., Ltd., Tokyo (JP)

( * ) Notice: Subject to any disclaimer, the term of this patent is extended or adjusted under 35 U.S.C. 154(b) by 412 days.

(21) Appl. No.: 10/510,345

(22) PCT Filed: Apr. 11, 2003

(86) PCT No.: PCT/JP03/04666

§ 371 (c)(1),
(2), (4) Date: Oct. 6, 2004

(87) PCT Pub. No.: WO03/087187

PCT Pub. Date: Oct. 23, 2003

(65) Prior Publication Data

US 2005/0148694 A1   Jul. 7, 2005

(30) Foreign Application Priority Data

Apr. 15, 2002 (JP) ............... 2002-112353
Nov. 15, 2002 (JP) ............... 2002-331948

(51) Int. Cl.
*C08K 5/13* (2006.01)
*C08K 5/134* (2006.01)
*C08K 5/36* (2006.01)
*C08K 5/526* (2006.01)
*C08L 63/00* (2006.01)
*C08F 136/06* (2006.01)
*C08F 136/08* (2006.01)

(52) U.S. Cl. ............ 525/523; 523/451; 523/453; 523/456; 525/333.1; 525/333.2

(58) Field of Classification Search ............ None
See application file for complete search history.

(56) References Cited

U.S. PATENT DOCUMENTS

| | | | | |
|---|---|---|---|---|
| 4,594,388 A | * | 6/1986 | Arai | ............ 525/177 |
| 5,981,616 A | | 11/1999 | Yamamura et al. | |
| 6,498,200 B1 | * | 12/2002 | Suzuki et al. | ............ 522/13 |
| 6,783,840 B2 | * | 8/2004 | Watanabe et al. | ............ 428/209 |
| 6,916,855 B2 | * | 7/2005 | Jansen et al. | ............ 522/167 |
| 6,924,008 B2 | * | 8/2005 | Takai et al. | ............ 428/1.1 |

FOREIGN PATENT DOCUMENTS

| | | | |
|---|---|---|---|
| EP | 0 848 294 A1 | | 6/1998 |
| JP | 10-168165 A | | 6/1998 |
| JP | 11-140279 A | * | 5/1999 |
| JP | 11-246647 A | * | 9/1999 |
| JP | 2001-131516 A | * | 5/2001 |
| JP | 2003-026993 A | | 1/2003 |
| JP | 2003-26993 A | * | 1/2003 |

OTHER PUBLICATIONS

Derwent accession No. 1998-314650 for Japanese Patent No. 10-168165 and U.S. Patent No. 5,981,616, Yamamura et al., Jun. 23, 1008.*

* cited by examiner

*Primary Examiner*—Robert Sellers
(74) *Attorney, Agent, or Firm*—Sughrue Mion, PLLC

(57) ABSTRACT

A radiation curable resin composition comprises a glycidyloxy groups-containing polybutadiene or hydrogenated polybutadiene, a mono-oxetane compound or monofunctional epoxy compound, and a cationic photopolymerization initiator.

8 Claims, No Drawings

GLYCIDYLOXY GROUPS-CONTAINING POLYBUTADIENE, MONO-OXETANE COMPOUND AND CATIONIC PHOTOINITIATOR

TECHNICAL FIELD

The present invention relates to a radiation curable resin composition that can be used when producing an electronic component or an optical component and that can also be used in printing, etc. The present invention also relates to a cured material formed by curing the radiation curable composition, the cured material having excellent resilience after deformation while having a very low modulus of elasticity at room temperature, and having excellent adhesion to a substrate having poor wettability such as a vapor-deposited ITO (tin-doped indium oxide) film. Furthermore, the present invention relates to a covering material for covering a vapor-deposited ITO film of a transparent touch panel or wiring formed thereon, and a covering material for coating an optical fiber.

BACKGROUND ART

The use of radiation curable resin compositions when producing electronic components or optical components has been increasing in recent years. This is because of high productivity, improvement in the working environment due to the absence of organic solvents, etc.

Against such a background, the radiation curable resin compositions are required to have various physical properties according to the location in which they are used.

For example, in an analog resistive film type transparent touch panel, resin dot spacers are generally used between upper and lower resistive films. When an attempt is made to improve the sensitivity of a touch panel, these dot spacers are desired to have both a lower modulus of elasticity and excellent resilience after deformation at around room temperature. Furthermore, when conductive film wiring is applied to a resistive film such as ITO using silver, etc., and this is covered with a resin for insulation, while taking into consideration improvement of the sensitivity, an insulating covering layer is desired to have a low modulus of elasticity and excellent resilience after deformation.

Here, the dot spacers and the insulating layer preferably have excellent adhesion to a substrate such as a vapor-deposited ITO film or silver.

Furthermore, since the dot spacers and the insulating layer have a detailed shape, they are often applied by printing, but in this case it is necessary for the resin to have an appropriate viscosity.

Among conventional radiation curable resin compositions, resins such as a UV adhesive can give cured materials having a low modulus of elasticity. However, their resilience after deformation is poor, that is, they have a large tan δ in a dynamic viscoelasticity measurement.

However, there are few radiation curable resin compositions that give a cured material having a low modulus of elasticity at around room temperature (storage modulus) and excellent resilience after deformation (low tan δ), and there is no cured material other than a silicone-based material that can give a storage modulus (G') of $1.2 \times 10^5$ Pa or less and a tan δ of 0.14 or less in a dynamic viscoelasticity measurement (25° C., 1 Hz). However, since the silicone based resin has very poor adhesion to various types of substrates, it is not suitable when adhesion to the substrate is required.

Moreover, even when a radiation curable resin composition containing no silicone-based resin is used, sufficient adhesion cannot be obtained if the substrate is a metal oxide vapor-deposited film having poor wettability, for example, a vapor-deposited ITO film.

That is, the conventional radiation curable resin compositions cannot give a cured material having a storage modulus (G') of $1.2 \times 10^5$ Pa or less and a tan δ of 0.14 or less in a dynamic viscoelasticity measurement (25° C., 1 Hz), and having excellent adhesion to a vapor-deposited ITO film.

DISCLOSURE OF INVENTION

It is an object of the present invention to provide a radiation curable resin composition that gives a cured material having excellent resilience after deformation while having a low modulus of elasticity, and having excellent adhesion to a substrate having poor wettability such as a vapor-deposited ITO film, the radiation curable resin composition also having an appropriate viscosity so as to enable its use in printing, etc.

As a result of an intensive investigation by the present inventors in order to solve the above-mentioned problems, it has been found that the problems can be solved by the invention below, and the present invention has thus been accomplished.

A radiation curable resin composition comprising a polyfunctional epoxy polymer (Component A) having a polybutadiene skeleton or a hydrogenated polybutadiene skeleton and two or more glycidyloxy groups in the molecule; an oxetane compound (Component B) represented by Formula (1) below and/or a monofunctional epoxy compound (Component C) having 8 to 30 carbons; and a cationic photopolymerization initiator (Component X).

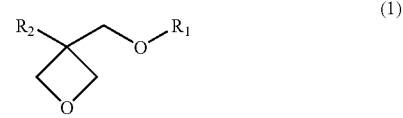

In Formula (1), $R_1$ denotes an optionally branched alkyl group having 6 to 30 carbons, or a phenyl group substituted with an alkyl group having 4 to 30 carbons, and $R_2$ denotes a hydrogen atom or an optionally branched alkyl group having 1 to 6 carbons.

Since a cured material obtained by curing the above-mentioned radiation curable resin composition has excellent adhesion to various types of substrates, a low modulus of elasticity, and good shape recovery, it can be used in various applications.

With regard to physical properties, it is preferable for this cured material to have a storage modulus (G') of $1.2 \times 10^5$ Pa or less and a tan δ of 0.14 or less in a dynamic viscoelasticity measurement at 25° C. and 1 Hz.

BEST MODE FOR CARRYING OUT THE INVENTION

The present invention is explained in detail below.

In the explanation below, polybutadiene and hydrogenated polybutadiene are called simply 'polybutadiene', and a polybutadiene skeleton and a hydrogenated polybutadiene skeleton are called simply a 'polybutadiene skeleton'.

The radiation curable composition of the present invention includes as essential components a polyfunctional epoxy polymer (Component A) having a polybutadiene skeleton and at least two glycidyloxy groups in the molecule; an oxetane compound (Component B), which will be described later, and/or a monofunctional epoxy compound (Component C) having 8 to 30 carbons; and a cationic photopolymerization initiator (Component X).

That is, the radiation curable composition of the present invention includes as essential components (i) Component A, Component B, and Component X; (ii) Component A, Component C, and Component X; or (iii) Component A, Component B, Component C, and Component X.

In the present invention, it is preferable that a polyfunctional epoxy compound other than Component A and/or a polyfunctional oxetane compound is not contained at 10 parts or greater relative to 100 parts of the total resin components. The 'polyfunctional epoxy compound' referred to here means a compound having at least two oxirane rings in the molecule. The 'polyfunctional oxetane compound' referred to here means a compound having at least two oxetane rings in the molecule. In the present invention, the mixing ratio is on the basis of weight.

Furthermore, the radiation curable composition of the present invention can contain an oxetane compound (Component B) represented by Formula (1) and/or a monofunctional epoxy compound having 8 to 30 carbons (Component C) as essential components. Moreover, it can contain a polymer having a glass transition temperature of −30° C. or lower (Component D) as an optional component. The essential components and the optional component forming the radiation curable composition of the present invention are explained below.

(Component A)

Component A is a polyfunctional epoxy polymer having a polybutadiene skeleton and having at least two glycidyloxy groups in the molecule, and examples thereof include one obtained from a polybutadiene having hydroxyl groups at both terminals by converting the two terminal hydroxyl groups into glycidyloxy groups, and one obtained from a polybutadiene having carboxyl groups at both terminals by adding to the two terminals a molecule having two glycidyloxy groups in the molecule. In the present invention, one obtained from a polybutadiene having hydroxyl groups at both terminals by converting the two terminal hydroxyl groups into glycidyloxy groups is preferably used.

It is also possible to achieve desired effects by the use, as Component A, of a polymer having a polyisoprene skeleton instead of the potybutadiene skeleton and having at least two glycidyloxy groups in the molecule.

Here, the polybutadiene may be one obtained by radical polymerization or one obtained by anionic polymerization. The molecular weight of the polybutadiene in Component A is preferably 1,000 to 100,000, more preferably 2,000 to 100,000, and particularly preferably 2,000 to 10,000.

With regard to a hydrogenated polybutadiene referred to in the present invention, the degree of hydrogenation thereof is preferably 60% or less, more preferably 40% or less, and most preferably 20% or less. When the degree of hydrogenation is too high, the compatibility becomes poor in some cases.

The main chain skeleton of the polymer as Component A is not limited to that of a polybutadiene homopolymer, and may be that of a block copolymer with a monomer such as acrylonitrile, styrene, or a butene other than butadiene. It is essential for the main chain skeleton to have a polybutadiene block. The molecular weight of the polybutadiene block is preferably 1,000 to 100,000, more preferably 2,000 to 100,000, and particularly preferably 2,000 to 10,000.

Component A of the present invention is a polymer having at least two glycidyloxy groups in the molecule, and the number of glycidyloxy groups is preferably two. When there are too many glycidyloxy groups, the storage modulus of the cured material becomes too high, which is undesirable.

Specific examples of Component A include one obtained from a polybutadiene having terminal hydroxyl groups by reacting the hydroxyl groups with epichlorohydrin, DENAREX R45EPT (manufactured by Nagase ChemteX Corporation) in which the hydroxyl groups of a polybutadiene having terminal hydroxyl groups are converted into glycidyloxy groups, and NISSO-PB EPB-13 (manufactured by Nippon Soda Co., Ltd.), which is derived from an α,ω-polybutadienedicarboxylic acid.

(Component B)

Component B of the present invention is an oxetane compound represented by Formula (1) below.

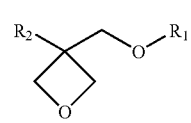

In the formula, $R_1$ is an optionally branched alkyl group having 6 to 30 carbons, or a phenyl group substituted with an optionally branched alkyl group having 4 to 30 carbons, and examples of $R_1$ include hexyl, octyl, 2-ethylhexyl, octadecyl, 2,4-di-tert-butylphenyl, 2,4-di-tert-amylphenyl, nonylphenyl, dodecylphenyl, and octadecylphenyl groups. $R_2$ is a hydrogen atom or an optionally branched alkyl group having 1 to 6 carbons, and examples of $R_2$ include methyl, ethyl, propyl, isopropyl, butyl, isobutyl, t-butyl, amyl, isoamyl, and hexyl.

The alkyl group denoted by $R_1$ or $R_2$ may have a substituent. This substituent can be any substituent as long as it does not interfere with cationic polymerization, that is, the alkyl group may be substituted with any substituent that does not affect cationic polymerization. Examples of substituents that are allowed for the alkyl group include C1 to C12 alkoxy groups, C2 to C12 acyloxy groups, C2 to C12 alkoxycarbonyl groups, a phenyl group, a benzyl group, a benzoyl group, a benzoyloxy group, a halogen atom, and a phenylthio group.

Specific examples of Component B include the oxetane monomer OXT-212 (manufactured by Toagosei Co., Ltd.) in which $R_1$ is 2-ethylhexyl, which has 8 carbons, and $R_2$ is ethyl, and the oxetane monomer OXR-18 (manufactured by Toagosei Co., Ltd.) in which $R_1$ is octadecyl, which has 18 carbons, and $R_2$ is ethyl.

The oxetane compound is used preferably since its reactivity is good and photocuring is achieved in a short period of time. The oxetane compound in which $R_1$ is 2-ethylhexyl and $R_2$ is ethyl is preferably used as an excellent diluent, curing accelerator, flexibility imparting agent, and surface tension reducing agent.

One embodiment of the composition of the present invention contains as essential resin components Component A and Component B. In accordance with this composition, the glass transition temperature of a cured material obtained by curing the composition can be decreased, and the crosslink density can be reduced. As a result, a cured material having a low modulus of elasticity at around room temperature and good resilience after deformation can be obtained. Furthermore, the cured material of the present invention has excellent adhesion to a substrate having very poor wettability such as a vapor-deposited ITO film. Moreover, since Component B has excellent polymerizability, not only does the composition have excellent curability, but also a cured material that does not become brittle can be obtained. In addition, since the composition is formed from Component A, which has high viscosity, and Component B, which has low viscosity, the viscosity of the composition can be adjusted over a wide range.

Another embodiment of the composition of the present invention contains as essential resin components Component A and Component C. Yet another embodiment of the composition of the present invention contains as essential resin components Component A, Component B, and Component C. In accordance with any of these combinations, it is possible to decrease the glass transition temperature of a cured material obtained by curing the composition and reduce the crosslink density.

The radiation curable composition of the present invention preferably does not contain 10 parts or greater of a polyfunctional epoxy compound other than Component A and the polyfunctional oxetane compound relative to 100 parts of the total resin components. That is, when a polyfunctional epoxy compound other than Component A and/or a polyfunctional oxetane compound is present, the total content thereof is preferably less than 10 parts relative to 100 parts of the total resin components, and more preferably less than 5 parts. Although the polyfunctional oxetane compound and the polyfunctional epoxy compound can be used for the purpose of increasing the cure rate of the composition and controlling the strength after curing, when the content thereof is 10 parts or greater relative to 100 parts of the resin components, the modulus of elasticity of the cured material undesirably increases.

The 'resin components' referred to in the present invention denote the resin composition excluding a polymerization initiator such as a cationic photopolymerization initiator (Component X). Furthermore, when other additives such as a filler and an expander are used, they are also excluded.

With regard to the polyfunctional epoxy compound other than Component A, there can be cited as examples dicyclopentadiene dioxide, limonene dioxide, 4-vinylcyclohexene dioxide, 3,4-epoxycyclohexylmethyl-3',4'-epoxycyclohexanecarboxylate, di(3,4-epoxycyclohexyl) adipate, a bisphenol A epoxy resin, a halobisphenol A epoxy resin, a bisphenol F epoxy resin, o-, m-, and p-cresol novolac epoxy resins, and a phenol novolac epoxy resin.

With regard to the polyfunctional oxetane compound, compounds represented by Formula (2) below can be cited as examples.

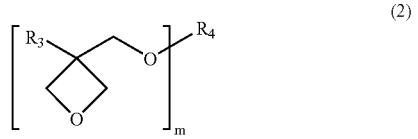

(2)

In the formula, m is an integer of 2 or greater, $R_3$ denotes methyl or ethyl, and $R_4$ denotes an m-valent connecting group.

(Component C)

The composition of the present invention may contain a monofunctional epoxy compound having 8 to 30 carbons (Component C) in addition to Component A and Component B, or may contain Component C in addition to Component A.

The monofunctional epoxy compound having 8 to 30 carbons (Component C) is a compound in which an optionally branched alkyl group having 8 to 30 carbons has one epoxy group. Examples of the alkyl group include octyl, decyl, dodecyl, tetradecyl, hexadecyl, and octadecyl.

Specific examples of Component C include 1,2-epoxyhexadecane (product name UVR-6216, Dow Chemical Japan Ltd.).

A preferred number of parts of Component A added in the present invention depends on the structure of Component A, but it is 1 to 50 parts relative to 100 parts of the total resin components, preferably 10 to 50 parts, and more preferably 25 to 45 parts. When it is less than 1 part, there are the problems that the curability is degraded and a uniform cured material cannot be obtained. When it is greater than 50 parts, the modulus of elasticity of the cured material undesirably increases.

When Component B or Component C is used singly in the present invention, and when Component B and Component C are used in combination, the number of parts thereof added is not particularly limited, but the number of parts of Component B and/or Component C is 10 to 80 parts relative to 100 parts of the total resin components, preferably 20 to 70 parts, and more preferably 30 to 60 parts. When the total amount of Component B and Component C is too small, for example, less than 10 parts, it becomes difficult to achieve a low modulus of elasticity and shape recovery at the same time, which is undesirable. When it is greater than 80 parts, the viscosity of the composition becomes too low, and it becomes difficult to obtain a viscosity appropriate for printing even by adding a filler, etc., which is undesirable.

(Component D)

When the composition of the present invention is applied by a method such as screen printing, a suitable viscosity is needed. Although the final viscosity can be increased by adding a filler such as silica, a resin having a viscosity of 100 mPa·s or less at room temperature cannot be used suitably in screen printing, etc. In such a case, it is necessary for the resin to have a viscosity of at least a few hundred mPa·s at room temperature, and the viscosity is preferably a few thousand mPa·s.

For the above-mentioned reason, in order to increase the viscosity of the composition prior to curing, the composition of the present invention may contain a polymer having a glass transition temperature of −30° C. or less (Component D). When a polymer having a glass transition temperature of greater than −30° C. is added, the modulus of elasticity and the tan δ at around room temperature of the cured material undesirably increase. Component D is preferably one having good compatibility prior to curing and subsequent to curing.

The amount of Component D added to the composition of the present invention is preferably 50 parts or less relative to 100 parts of the total resin components, and more preferably 40 parts or less. When it is more than 50 parts, the tan δ at around room temperature of the cured material undesirably increases.

Preferred examples of the polymer (Component D) include polybutadiene or polyisoprene to which 1 to 20 molecules of maleic anhydride are added per polymer molecule, and one obtained by ring-opening these acid anhydrides with an alcohol. It is preferable, from the viewpoint of stability of the composition over time, for the acid anhydride to be ring-opened with an appropriate alcohol. The alcohol used for ring-opening of the acid anhydride is not particularly limited; an alkyl alcohol having 1 to 10 carbons is preferable, and methanol is particularly preferable.

Specific examples of Component D include a polybutadiene having terminal hydroxyl groups (Poly bd R45HT, manufactured by Idemitsu Peterochemical), an α,ω-polybutadiene glycol (G-3000, manufactured by Nippon Soda Co., Ltd.), a hydrogenated α,ω-polybutadiene glycol (GI-3000, manufactured by Nippon Soda Co., Ltd.), an α,ω-polybutadienedicarboxylic acid (C-1000, manufactured by Nippon Soda Co., Ltd.), a hydrogenated α,ω)-polybutadienedicarboxylic acid (CI-1000, manufactured by Nippon Soda Co., Ltd.), a polymer obtained by adding maleic anhydride to a polyisoprene and then ring-opening with methanol (Kuraprene LIR-410, manufactured by Kuraray Co., Ltd.), and a polybutadiene to which maleic anhydride has been added (Nisseki Polybutadiene M-1000-80, manufactured by Nippon Petrochemicals Co., Ltd.).

It is necessary for the composition of the present invention to contain a cationic polymerization initiator (Component X) that initiates cationic polymerization on irradiation with actinic radiation. It is essential for the cationic polymerization initiator to dissolve in the resin composition and it is preferable for it to have excellent curability.

Examples of the cationic polymerization initiator include a diazonium salt, an iodonium salt, a sulfonium salt, a selenium salt, a pyridinium salt, a ferrocenium salt, a phosphonium salt, and a thiopyrilium salt. An onium salt photoinitiator such as an aromatic iodonium salt or an aromatic sulfonium salt, which are relatively thermally stable, is preferably used. In order to activate the onium salt photoinitiator, it is preferable to irradiate with ultraviolet light or visible light as the actinic radiation.

When the onium salt photoinitiator such as an aromatic iodonium salt or an aromatic sulfonium salt is used, examples of the anion include $BF_4^-$, $AsF_6^-$, $SbF_6^-$, $PF_6^-$, and $B(C_6F_5)_4^-$, and among these, an iodonium salt having $B(C_6F_5)_4^-$ as the anion is suitable since it has good compatibility with the oxetane compound.

When the composition of the present invention contains Component A and Component C as essential components, it is preferable from the viewpoint of curability to use a cationic photopolymerization initiator having $SbF_6^-$ or $B(C_6F_5)_4^-$ as the anion of Component X rather than a cationic photopolymerization initiator having a phosphorus-based anion such as $PF_6^-$.

When the composition of the present invention contains Component A and Component B as essential components, any of the cationic photopolymerization initiators can be used preferably.

In the present invention, although X-rays, an electron beam, etc. can be used as the actinic radiation, it is preferable to use ultraviolet light. In the present invention, when ultraviolet light is used as the actinic radiation, its wavelength range is not particularly limited, but it is preferably in the range of 150 to 400 nm, and more preferably 200 to 380 nm. When ultraviolet light is used, the above-mentioned various types of cationic photopolymerization initiators are activated, thereby efficiently initiating cationic polymerization of the curable resin composition of the present invention. A cationic photopolymerization initiator suitable for the resin composition of the present invention is one having bis(alkylphenyl) iodonium as the cationic component and $PF_6^-$, $SbF_6^-$, or $B(C_6F_5)_4^-$ as the anionic component, and particularly preferred specific examples thereof include bis(dodecylphenyl) iodonium hexafluoroantimonate (main component of UV-9380C, manufactured by GE Toshiba Silicones) and tolylcumyliodonium tetrakis(pentafluorophenyl)borate (PHOTOINITIATOR 2074, manufactured by Rhodia).

Furthermore, the resin composition of the present invention may further contain a sensitizer as necessary in order to improve the activity of the cationic polymerization initiator. The sensitizer used in combination with the above-mentioned cationic photopolymerization initiator is not particularly limited, and generally used radical photopolymerization initiators can be used suitably.

Typical examples of sensitizers that can be used in the present invention include compounds disclosed by Crivello in Adv. in Polymer Sci., 62, 1(1984). Specific examples thereof include pyrene, perylene, acridine orange, thioxanthone, 2-chlorothioxanthone, and benzoflavin.

Furthermore, general examples of radical photopolymerization initiators that can be used include benzophenone, thioxanthones such as 2,4-diethylthioxanthone, 2-isopropylthioxanthone, and 2,4-dichlorothioxanthone, benzoin ethers such as benzoin methyl ether, benzoin ethyl ether, and benzoin isopropyl ether, benzil dimethyl ketals such as 2,2-dimethoxy-1,2-diphenylethan-1-one, α-hydroxyalkylphenones such as 2-hydroxy-2-methyl-1-phenylpropan-1-one, 1-(4-isopropylphenyl)-2-hydroxy-2-methylpropan-1-one, and 1-hydroxycyclohexyl phenyl ketone, and α-dicarbonyl compounds such as camphorquinone.

In the present invention, the thioxanthones and the α-hydroxyalkylphenones are preferable since the activity of the onium salt is most enhanced.

The proportions of the cationic photopolymerization initiator (Component X) and the sensitizer added can be adjusted as appropriate according to the amount of ultraviolet light irradiation and the curability of the resin, but they are generally preferably 0.1 to 10 parts relative to 100 parts of the total resin components, and more preferably 0.1 to 5 parts. When the sensitizer is added to the composition of the present invention, with regard to the ratio of the sensitizer to Component X, the sensitizer is preferably added at 0.05 to 5 parts relative to 1 part of Component X, and more preferably 0.5 to 3 parts. When the amounts of Component X and the sensitizer added are less than 0.1 parts, the curability is degraded, whereas when they exceed 10 parts, components essential to the cured material are reduced and the physical properties of the cured material might be degraded, or the cured material might be strongly colored.

The radiation curable resin composition of the present invention may be further heated after curing with actinic radiation so as to carry out polymerization and increase the degree of polymerization. In this case, it is preferable to add a thermal cationic polymerization initiator.

The thermal cationic polymerization initiator referred to here is one that is activated by heating and induces ring-opening polymerization of a ring-opening polymerizable group of an epoxy compound, an oxetane compound, etc., and examples thereof include various types of onium salts such as a quaternary ammonium salt, a phosphonium salt, and a sulfonium salt.

With regard to the onium salts, for example, a commercial compound such as Adekaopton CP-66 or Adekaopton CP-77 (both product names, manufactured by Asahi Denka Co., Ltd.), San-aid SI-60L, San-aid SI-80L, or San-aid SI-100L (all product names, manufactured by Sanshin Chemical Industry Co., Ltd.), or the CI series (manufactured by Nippon Soda Co., Ltd.) can be used.

The amount of thermal cationic polymerization initiator added is preferably in the range of 0.01 to 5 parts relative to 100 parts of the resin components. When this amount added is less than 0.01 parts, even if this initiator is activated by the action of heat, a ring-opening reaction of the ring-opening polymerizable group might not proceed sufficiently. Moreover, even if the initiator is added at more than 5 parts, the effect in making the polymerization proceed is not improved any further, and instead the curing performance might be degraded.

The radiation curable resin composition of the present invention may further contain an antioxidant.

Examples thereof include a phenol-based antioxidant, a sulfur-based antioxidant, and a phosphorus-based antioxidant.

Specific examples of the phenol-based antioxidant include hydroquinone monomethyl ether, 2,6-di-t-butylhydroxytoluene, 2,2'-methylenebis(4-methyl-6-t-butylphenol), 4,4'-butylidenebis(3-methyl-6-t-butylphenol), triethylene glycol bis [3-(3'-t-butyl4-hydroxy-5-methylphenyl)] propionate, pentaerythritol tetrakis[3-(3,5-di-t-butyl4-hydroxyphenyl) propionate], n-octadecyl-3-[(3',5'-di-t-butyl-4'-hydroxyphenyl) propionate, and 4,4'-thiobis(3-methyl-6-t-butyl)phenol.

Specific examples of the sulfur-based antioxidant include dilauryl-3,3'-dithiopropionate, dimyristyl-3,3'-thiodipropionate, distearyl-3,3'-dithiopropionate, and pentaerythritol tetrakis(3-laurylthiopropionate).

Specific examples of the phosphorus-based antioxidant include trisnonylphenylphosphite, distearylpentaerythritol diphosphite, tris(2,4-di-t-butylphenyl)phosphite, and tetrakis (2,4-di-t-butylphenyl)4,4'-biphenylene diphosphite.

As the antioxidant, a hindered phenol-based antioxidant such as triethylene glycol bis[3-(3-t-butyl-5-methyl-4-hydroxylphenyl) propionate], 1,6-hexanediol bis[3,5-di-t-butyl-4-hydroxyphenyl] propionate], or pentaerythritol tetrakis [3-(3,5-di-t-butyl4-hydroxyphenyl) propionate] can be used preferably.

The amount of antioxidant used is not particularly limited as long as an effect in preventing oxidation can be exhibited, but the amount used is generally 0.1 to 10 parts relative to 100 parts of the total resin components, and preferably 0.5 to 5 parts.

In order to cure the radiation curable resin composition (cationic photopolymerizable resin) of the present invention, an ionic component that generates a cationic polymerization initiating species with light is needed. This ionic component, and an anionic component in particular, might cause corrosion or migration of electrical wiring. From an environmental viewpoint, if an electrical product employing the present resin cured material is disposed of inappropriately, it is preferable to minimize the amount of ionic component leaching out into the environment. From the above-mentioned viewpoint, it is important to suppress leaching of the ionic component from the cured material. The extent to which the ionic component is suppressed from leaching out of the cured material can be determined as a decrease in the electrical conductivity of an extract obtained by extracting the cured material with hot water.

In order to suppress leaching of the ionic component from the cured material, an inorganic ion-exchanger is preferably added to the radiation curable resin composition of the present invention. The 'inorganic ion-exchanger' referred to here means an ion-exchanger that is formed from a resin whose skeleton is formed from an inorganic atom (zirconium, antimony, bismuth, magnesium, aluminum, etc.) other than a carbon atom and has an ion-exchanging ability. Specific examples of the inorganic ion-exchanger include anion-exchange types such as IXE-500, IXE-530, IXE-550, IXE-700, IXE-700F, and IXE-800 (all product names, manufactured by Toagosei Co., Ltd.) and cation-exchange types such as IXE-100 and IXE-300. Furthermore, examples of amphoteric ion-exchange types include IXE-600, IXE-633, and IXE-6136 (all product names, manufactured by Toagosei Co., Ltd.).

In the composition of the present invention, it is preferable to use an anion-exchange type or amphoteric ion-exchange type inorganic ion-exchanger.

The amount of inorganic ion-exchanger added can be selected appropriately, but it is generally preferably 1 to 20 parts relative to 100 parts of the total resin components, and more preferably 2 to 10 parts.

Use of the inorganic ion-exchanger in the radiation curable resin composition of the present invention enables ionic impurities present in components in which the resin is used to be removed, thus preventing the occurrence of corrosion and migration of the wiring of electrical components, etc. and thereby improving the reliability and durability of the components.

In addition, the resin composition of the present invention may contain a filler such as fine silica particles for the purpose of increasing the viscosity and introducing thixotropic properties. The amount of filler added can be adjusted as appropriate, but from the viewpoint of maintenance of a low modulus of elasticity, the amount thereof used is generally preferably 0 to 10 parts relative to 100 parts of the resin components of the present invention.

It is also possible for the resin composition of the present invention to contain a coupling agent such as a silane coupling agent in order to further improve the adhesion.

Since the resin composition of the present invention gives a cured material that has excellent resilience after deformation while maintaining a very low modulus of elasticity at room temperature and has excellent adhesion to a substrate having poor wettability, it can be suitably used as a material of an electronic component and an optical component which require the above-mentioned physical properties.

The storage modulus (G') of the cured material of the present invention is preferably $1.2 \times 10^5$ Pa or less, and more preferably $1.0 \times 10^5$ Pa or less.

The tan δ of the cured material of the present invention is 0.14 or less, preferably 0.12 or less, and more preferably 0.1 or less.

Furthermore, since the resin composition of the present invention can be adjusted so as to have a viscosity at room temperature of a few hundred to a few thousand mPa·s, after a filler, etc. is added, the composition can be applied in a detailed shape by printing such as screen printing.

Specifically, the composition is used in the production of a transparent touch panel, the production of an optical fiber, etc. In the former case, the composition is used as a dot spacer or as an insulating layer for covering a resistive film, such as a vapor-deposited ITO film and/or a conductive film formed on the resistive film. In the latter case, the composition can be used as a coating material.

Production of a covering material for a touch panel is now explained.

When the resin composition of the present invention is used as a covering material for a touch panel, it is preferable for the resin composition to contain the cationic polymerization initiator that initiates cationic polymerization on irradiation with actinic radiation. Furthermore, in order to accelerate this polymerization, the sensitizer can be used in combination with the initiator. After curing the present composition by irradiation with actinic radiation, in order to increase the degree of polymerization, post-polymerization can be carried out by repeating the irradiation with actinic radiation or by heating. When thermal polymerization is carried out, it is preferable to add a thermal cationic polymerization initiator. Moreover, in order to adjust the viscosity, a filler such as fine silica particles may be added.

When the resin composition is used for a dot spacer, a vapor-deposited ITO film formed on a transparent insulating substrate by sputtering, etc. is coated with the resin composition of the present invention by means of screen printing, etc. so as to form dots having dimensions of on the order of a few tens of μm. These are exposed to actinic radiation such as ultraviolet light, thus curing the printed resin composition. Since the resin composition of the present invention gives a very low modulus of elasticity and excellent resilience after deformation, it is used suitably when a high sensitivity touch panel is produced. Since the resin composition gives good adhesion to a vapor-deposited ITO film having poor wettability, excellent reliability is obtained.

When an insulating layer is formed by covering, with the resin composition, a conductive film made from silver, etc. formed on a vapor-deposited ITO film, as for the dot spacer explained above, printing techniques such as screen printing can be used suitably. For example, the structure of a resistive film type touch panel is briefly explained below. A transparent resistive film comprising a vapor-deposited ITO film is formed over a whole panel, and a band-shaped conductive film such as silver is formed at opposite ends of the resistive film; when the resin is applied so as to cover the conductive films at opposite ends, a method involving printing, such as screen printing, is suitable. The resin is subsequently cured by irradiation with actinic radiation, and an insulating layer having a low modulus of elasticity and excellent resilience after deformation can be obtained. The position of the conductive film is not limited to the case in which it is located at opposite ends of a panel.

Production of a covering material for an optical fiber is now explained.

The resin composition of the present invention can be used suitably as a covering material for an optical fiber. The resin composition used as a covering layer for an optical fiber is required to have physical properties such as low viscosity for excellent coating performance, excellent curability, flexibility, stability of physical properties over a wide temperature range, and low water absorption.

Since the viscosity of the resin composition of the present invention can be adjusted over the range of a few hundred to a few thousand mPa·s, the coating performance is excellent. Furthermore, since the polymerization of the resin composition is not inhibited by oxygen, which is seen with a radical polymerization-based resin such as an acrylate type, the resin composition of the present invention exhibits excellent curability, particularly as a thin film. Moreover, the present cured material is designed to have a glass transition temperature of a few tens of degrees below zero in order to reduce the modulus of elasticity (G') and the tan δ at around room temperature. This means that the physical properties change little even at quite a low temperature. Furthermore, the present cured material has excellent heat resistance and has the advantage that its physical properties are stable over a wide temperature range. Although an acrylate-based resin has relatively high water absorption, since the present composition comprises a butadiene skeleton and a polyether structure, it is also an advantage that the present cured material has low water absorption.

Since the resin composition of the present invention has the above-mentioned physical properties, it can be used suitably as a covering material for an optical fiber.

As the method for covering an optical fiber, various types of methods can be employed with no particular limitation, and one example thereof is a method in which, immediately after a glass fiber is thermally melt-spun, it is made to pass through a layer of the resin composition and cured by irradiation with ultraviolet light. However, the above-mentioned method should not be construed as being limiting, and the method can be changed as appropriate to involve, for example, coating by spraying. It is also possible to use a plastic fiber instead of the glass fiber.

From a different viewpoint than the above, since the resin composition of the present invention gives a cured material having a low modulus of elasticity and excellent resilience after deformation, it can be used as a resin for a pressure-sensitive conductor. For example, fine conductive particles and microcapsules that expand on heating are added to the resin composition of the present invention, cured by actinic radiation, and then heated so as to make the microcapsules expand, and a pressure-sensitive conductor, which exhibits electrical conductivity only when pressure is applied, can thus be obtained.

Use of such a pressure-sensitive conductor enables various types of switches and a transparent touch panel to be fabricated.

It is also possible to produce a liquid crystal panel by adding a liquid crystal to the composition of the present invention, inserting this mixture between a pixel electrode and an opposing electrode, which is a transparent electrode such as ITO, and applying actinic radiation such as ultraviolet light. With regard to the liquid crystal, a nematic liquid crystal, a smectic liquid crystal, a cholesteric liquid crystal, etc. can be used.

Since the cured material formed from the composition of the present invention has excellent adhesion, the electrode does not peel off from the liquid crystal layer, thus greatly suppressing the production of defective products.

Since the cured material from the composition of the present invention gives a very low modulus of elasticity, it is possible to minimize stress caused by deformation of a substrate or stress caused by strain due to differences in the coefficient of thermal expansion of different types of materials and to prevent peeling, etc. due to the stress, and the composition is useful as a material for coating or laminating a flexible substrate or as a material for laminating layers having different coefficients of thermal expansion such as metal and plastic.

Furthermore, since the composition gives very low modulus of elasticity, it is possible to carry out bonding while minimizing any build-up of stress, and the composition is useful for the bonding of members where fine positioning is required, such as the bonding of an optical pickup lens.

EXAMPLES

The present invention is explained more specifically below with reference to Examples and Comparative Examples. However, the present invention is not limited to the Examples below. 'Parts' and '%' are both on a weight basis.

Examples 1 to 11, Comparative Example 1

The components shown in Table 1 were mixed by a standard method to give a radiation curable resin composition, and the physical properties thereof were evaluated.

The abbreviations used in Table 1 and Table 4 denote the following compounds.

R45EPT: Component A, a polybutadiene having two terminal hydroxyl groups thereof converted into glycidyloxy groups; DENAREX R45EPT, manufactured by Nagase ChemteX Corporation.

EHOX: Component B, 3-ethyl-3-(2-ethylhexyloxymethyl)oxetane; Aron oxetane OXT-212, manufactured by Toagosei Co., Ltd.

UVR6216: Component C, 1,2-epoxyhexadecane; UVR-6216, manufactured by Dow Chemical Japan Ltd.

LIR410: Component D, a polymer obtained by adding maleic anhydride to polyisoprene and then ring-opening with methanol (glass transition temperature −59° C., molecular weight 25,000); Kuraprene LIR410, manufactured by Kuraray Co., Ltd.

LIR310: Component D, a styrene-isoprene copolymer (glass transition temperature −63° C., molecular weight 31,000); Kuraprene LIR-310, manufactured by Kuraray Co., Ltd.

LIR50: Component D, an isoprene homopolymer (glass transition temperature −63° C., molecular weight 47,000); Kuraprene LIR-50, manufactured by Kuraray Co., Ltd.

UVR6110: 3,4-epoxycyclohexylmethyl-3',4'-epoxycyclohexanecarboxylate; UVR-6110, manufactured by Dow Chemical Japan Ltd.

UV9380C: cationic photopolymerization initiator, a cationic photopolymerization initiator having as the main component bis(dodecylphenyl)iodonium hexafluoroantimonate; UV-9380C, manufactured by GE Toshiba Silicones.

WPI016: cationic photopolymerization initiator, bis[4-alkyl (C10-C14) phenyl]iodonium hexafluoroantimonate; WPI-016, manufactured by Wako Pure Chemical Industries, Ltd.

2074: cationic photopolymerization initiator, tolylcumyliodonium tetrakis(pentafluorophenyl)borate; PHOTO-INITIATOR 2074, manufactured by Rhodia.

WPI-003: cationic photopolymerization initiator, bis[4-alkyl (C10-C14) phenyl]iodonium hexafluorophosphate; WPI-003, manufactured by Wako Pure Chemical Industries, Ltd.

Dc1173: sensitizer, 2-hydroxy-2-methyl-1-phenylpropan-1-one; Darocure 1173, manufactured by Ciba Specialties.

Irganox 1010: hindered phenol-based antioxidant, pentaerythritol tetrakis[3-(3,5-di-t-butyl-4-hydroxyphenyl) propionate]; Irganox 1010, manufactured by Ciba Specialties.

Methods for evaluating the physical properties are described below, and the evaluation results are given in Table 1.

Viscosity

Viscosity was measured using a viscometer (Model E manufactured by Toki Sangyo Co., Ltd.) at 25° C.

Measurement of Dynamic Viscoelasticity (G' and tan δ)

A 1 mm thick frame was formed on a polytetrafluoroethylene plate, the composition was poured into the frame and then irradiated with ultraviolet light using a mercury lamp. Irradiation was carried out at 365 nm with an intensity of 25 mW/cm$^2$ for 2 minutes, and after confirming that curing was completed to the reverse side, irradiation was repeated a total of 4 times, including front and reverse sides.

The dynamic viscoelasticity of the cured material thus obtained was measured at a temperature of 25° C. with a frequency of 1 Hz, and the storage modulus (G') and the tan δ were evaluated.

Adhesion

ITO vapor-deposited on polyethylene terephthalate (PET) was coated with the resin at 50 μm using a bar coater, and it was irradiated with ultraviolet light so as to cure the resin. With regard to the ultraviolet light irradiation conditions, a 160 W/cm focused high-pressure mercury lamp (single lamp) was used, the mercury lamp height was 10 cm, the conveyor speed was 10 m/min, and the number of passes was determined such that after confirming curing by touch, the sample was passed through five more times.

The adhesion was evaluated for the cured film in accordance with a crosscut tape method of JIS K-5400.

TABLE 1

| | Example 1 | Example 2 | Example 3 | Comparative Example 1 | Example 4 | Example 5 | Example 6 | Example 7 | Example 8 | Example 9 | Example 10 | Example 11 |
|---|---|---|---|---|---|---|---|---|---|---|---|---|
| R45EPT | 40 | 30 | 30 | | 30 | 30 | 30 | 30 | 30 | 30 | 30 | 30 |
| EHOX | 60 | 30 | 20 | 90 | | 20 | 20 | 40 | 40 | 40 | 20 | 20 |
| UVR6216 | | 20 | 20 | | 40 | 20 | 20 | | | | 20 | 20 |
| LIR410 | | 20 | 30 | | 30 | 30 | 30 | 30 | | | | |
| LIR310 | | | | | | | | | 30 | | 30 | |
| LIR50 | | | | | | | | | | 30 | | 30 |
| UVR6110 | | | | 10 | | | | | | | | |
| UV9380C | 1 | 1 | 1 | 1 | | | | | | | | |
| WPI-016 | | | | | 1.5 | 1.5 | 1.5 | | | | | |
| #2074 | | | | | | | | 1.5 | 1 | 1 | 1 | 1 |
| Dc 1173 | | | | | 1 | 1 | 1 | 2 | 2 | 2 | 2 | 2 |
| Irganox 1010 | | | | | | | 2 | 1 | 1 | 1 | 1 | 1 |
| Viscosity (25° C.) (mPa·s) | 197 | 822 | 2,259 | 5 | 2,470 | 2,290 | 2,480 | 2,745 | 2,912 | 6,099 | 2,920 | 6,124 |
| G' (Pa) | 9.0 × 10$^4$ | 4.0 × 10$^4$ | 3.7 × 10$^4$ | 4.0 × 10$^5$ | 6.2 × 10$^4$ | 6.7 × 10$^4$ | 5.7 × 10$^4$ | 6.2 × 10$^4$ | 7.8 × 10$^4$ | 1.2 × 10$^4$ | 6.0 × 10$^4$ | 4.2 × 10$^4$ |
| tan δ | 0.09 | 0.10 | 0.10 | 0.01 | 0.12 | 0.10 | 0.12 | 0.07 | 0.12 | 0.08 | 0.13 | 0.12 |
| Adhesion (points) | 10 | 10 | 10 | 2 | 10 | 10 | 10 | 10 | 10 | 10 | 10 | 10 |

The composition prepared in Example 6 was poured into a polytetrafluoroethylene frame on a polytetrafluoroethylene plate so that the thickness after curing was 1 mm, and cured by irradiation with ultraviolet light to give a cured material. This cured material was heated to 85° C., and changes in physical properties (storage modulus, tan δ, coloration) were examined over time. The cured material obtained by curing the composition of Example 6, which contained an antioxidant, showed little coloration or increase in the storage modulus, and no increase in the value of tan δ even after 360 hours in the above-mentioned forced aging test.

The results of measurement of the physical properties are given in Table 2.

TABLE 2

|  |  | Immediately after curing | 65 hours after | 156 hours after | 360 hours after |
|---|---|---|---|---|---|
| Example 6 | Coloration | A | B | B | B |
|  | G'(Pa) | $5.7 \times 10^4$ | $7.8 \times 10^4$ | $9 \times 10^4$ | $9.6 \times 10^4$ |
|  | tan δ | 0.12 | 0.10 | 0.09 | 0.06 |

Coloration: evaluated at three levels (determined using a 1 mm thick film)
A: slightly colored,
B: weakly colored,
C: strongly colored Example 12

100 parts by weight of the composition of Example 6 [mixture of 30 parts of Component A (R45EPT), 20 parts of Component B (EHOX), 20 parts of Component C (UVR6216), and 30 parts of Component D (LIR410) with 1.5 parts of cationic photopolymerization initiator (WPI-016), 1 part of sensitizer (Dc 1173), and 2 parts of antioxidant (Irganox 1010)] was mixed well with 2.5 parts by weight or 5 parts by weight of the inorganic anion-exchanger or amphoteric ion-exchanger described in Table 3 (all manufactured by Toagosei Co., Ltd.) to give IXE-containing compositions (IXE 1 to 10). These IXE-containing compositions and the composition of Example 6 were subjected to measurement of curability by irradiation with ultraviolet light and measurement of electrical conductivity of hot water extracts from the cured materials. The methods for measuring the physical properties are described below, and the measurement results are given in Table 3.

Curability

With regard to the curing performance of the IXE-containing compositions by irradiation with ultraviolet light, an OPP film (polypropylene film) was coated with each of the compositions at 20 μm using a bar coater, and irradiation with ultraviolet light was carried out using an 80 W/cm focused high-pressure mercury lamp (single lamp) at a mercury lamp height of 10 cm and a conveyor speed of 10 m/min. An evaluation was carried out of whether or not the composition coating was cured after the irradiation with ultraviolet light (curability of the composition was evaluated from the number of passes required to obtain a state in which the composition was cured and there was no exudation of the composition).

Electrical Conductivity

A polytetrafluoroethylene sheet was coated with the IXE-containing composition at a thickness of about 1 mm, the composition was cured by irradiation with a high-pressure mercury lamp (365 nm, 150 mW/cm$^2$) for 2 min, and the reverse side was further irradiated for 2 min under the same conditions. This irradiation was repeated to make a total of four times for the front and reverse sides (8 min). About 1 g of the cured material thus obtained (precise weight was measured for each of the cured materials) and 40 g of ion-exchanged water were placed in a polypropylene container, and maintained in a thermostatically controlled bath at 85° C. for 60 hours. After the 60 hours, the electrical conductivity of this water was measured. The amount of water was adjusted using ion-exchanged water so that there was 100 g per g of the cured material in the electrical conductivity measurement.

TABLE 3

| IXE-containing composition | IXE Type | Parts | Curability | Electrical conductivity μS/cm |
|---|---|---|---|---|
| IXE-1 | 550 | 5 | 2 | 40 |
| IXE-2 | 550 | 2.5 | 2 | 48 |
| IXE-3 | 530 | 5 | 2 | 42 |
| IXE-4 | 530 | 2.5 | 2 | 42 |
| IXE-5 | 633 | 5 | 2 | 45 |
| IXE-6 | 633 | 2.5 | 2 | 85 |
| IXE-7 | 6136 | 5 | 2 | 47 |
| IXE-8 | 6136 | 2.5 | 2 | 73 |
| IXE-9 | 700F | 5 | 2 | 12 |
| IXE-10 | 700F | 2.5 | 2 | 8 |
| Composition of Example 6 | None | 0 | 2 | 174 |

IXE550: Bismuth-based anion-exchanger
IXE530: Bismuth-based anion-exchanger
IXE633: Antimony, bismuth-based amphoteric ion-exchanger
IXE6136: Zirconium, bismuth-based amphoteric ion-exchanger
IXE700F: Magnesium, aluminum-based anion-exchanger As shown in Table 3, there was hardly any difference between the curability of the IXE-containing compositions and the curability of the composition containing no ion-exchanger.

As shown in Table 3, the electrical conductivity of the cured material obtained from the composition containing the anion-exchanger or the amphoteric ion-exchanger clearly decreased compared with the composition containing no ion-exchanger. It is clear from these results that the amount of ionic component extracted from the cured material with hot water decreased.

Examples 13 and 14

With regard to compositions obtained by mixing the components shown in Table 4 by a standard method, the curability was compared by the method below.

An OPP film (polypropylene film) was coated with each of the compositions shown in Table 4 at 20 μm using a bar coater, and irradiation with ultraviolet light was carried out using an 80 W/cm focused high-pressure mercury lamp (single lamp) at a mercury lamp height of 10 cm and a conveyor speed of 10 m/min. Each time irradiation with ultraviolet light was carried out, the state of the coated film was ascertained by touch. The curability was evaluated from the number of passes required to obtain a state in which the coated film was cured and there was no exudation of the composition. The results are given in Table 4.

TABLE 4

|  | Example 13 | Example 14 |
|---|---|---|
| R45EPT | 40 | 40 |
| EHOX | 60 | — |
| UVR6216 | — | 60 |
| WPI-003 | 3 | 3 |
| Dc 1173 | 1 | 1 |
| Curability | 1 | >10 |

INDUSTRIAL APPLICABILITY

Since the radiation curable resin composition of the present invention is a resin composition having a viscosity appropriate for use in printing, etc. and gives a cured material having a very low modulus of elasticity, excellent resilience after deformation, and excellent adhesion to a substrate having poor wettability such as a vapor-deposited ITO film, it can be used suitably for the production of an electronic component or an optical component where the above-mentioned physical properties are required.

The invention claimed is:

1. A radiation curable resin composition comprising:
   a polyfunctional epoxy polymer (Component A) having a polybutadiene skeleton or a hydrogenated polybutadiene skeleton and two glycidyloxy groups at both terminals in the molecule;
   an oxetane compound (Component B) represented by Formula (1) below and/or a compound in which an optionally branched alkyl group having 8 to 30 carbons has one epoxy group (Component C) having 8 to 30 carbons; and
   a cationic photopolymerization initiator (Component X),
   wherein a number of parts of Component A added is 25 to 45 parts by weight relative to 100 parts by weight of the total resin components

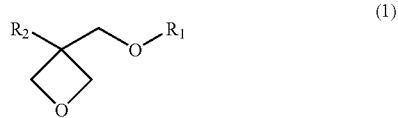
(1)

wherein $R_1$ denotes an optionally branched alkyl group having 6 to 30 carbons, or a phenyl group substituted with an alkyl group having 4 to 30 carbons, and $R_2$ denotes a hydrogen atom or an optionally branched alkyl group having 1 to 6 carbons,
   wherein a polyfunctional epoxy compound other than Component A and/or a polyfunctional oxetane compound are not contained at 10 parts or greater relative to 100 parts of the total resin components.

2. The radiation curable resin composition according to claim 1 wherein the composition further comprises an antioxidant.

3. The radiation curable resin composition according to claim 1, wherein the composition further comprises an inorganic ion-exchanger.

4. The radiation curable resin composition according claim 1 wherein the composition further comprises an antioxidant and an inorganic ion-exchanger.

5. A cured material formed by curing the radiation curable resin composition according to claim 1 by irradiation with actinic radiation.

6. A cured material formed by curing the radiation curable resin composition according to claim 2 by irradiation with actinic radiation.

7. A cured material formed by curing the radiation curable resin composition according to claim 3 by irradiation with actinic radiation.

8. A cured material formed by curing the radiation curable resin composition according to claim 4 by irradiation with actinic radiation.

* * * * *